United States Patent [19]
Yates

[11] Patent Number: 4,976,610
[45] Date of Patent: Dec. 11, 1990

[54] PURGE CANTILEVERED WAFER LOADING SYSTEM FOR LP CVD PROCESSES

[75] Inventor: Cleon R. Yates, Austin, Tex.

[73] Assignee: CRYCO Twenty-Two, Inc., Austin, Tex.

[21] Appl. No.: 355,753

[22] Filed: May 22, 1989

Related U.S. Application Data

[63] Continuation-in-part of Ser. No. 279,844, Dec. 5, 1988.

[51] Int. Cl.$^5$ ................................................ F27D 3/00
[52] U.S. Cl. ..................................... 432/11; 432/152; 432/253
[58] Field of Search .................. 432/5, 6, 11, 152, 253

[56] References Cited

U.S. PATENT DOCUMENTS

| | | | |
|---|---|---|---|
| 4,412,812 | 11/1983 | Sadowski et al. | 432/253 X |
| 4,439,146 | 3/1984 | Sugita | 432/5 X |
| 4,459,104 | 7/1984 | Wollmann | 432/123 |
| 4,518,349 | 5/1985 | Tressler et al. | 432/11 |
| 4,543,059 | 9/1985 | Whang et al. | 432/11 |
| 4,579,523 | 4/1986 | Laiquddin et al. | 432/5 X |
| 4,669,938 | 6/1987 | Hayward | 432/253 X |
| 4,767,251 | 8/1988 | Whang | 432/11 X |

Primary Examiner—Harold Joyce
Attorney, Agent, or Firm—Hugh D. Jaeger

[57] ABSTRACT

A movable cantilevered purge system providing for a wafer load position, a wafer purge position, and a wafer process position. The movable cantilevered purge system includes an elephant carrier vehicle for movement of a movable quartz elephant tube. The movable quartz elephant tube includes a purge injector and a return exhaust tube. A cantilevered paddle clamping vehicle moves behind the movable quartz elephant carrier vehicle and holds a silicon carbide or ceramic paddle. The elephant carrier vehicle includes a quartz sealing ring and a stainless steel sealing ring carried on pivotable adjusting blocks, and are supported by a plurality of cylindrical tubes. The quartz sealing ring concentrically positions about the process tube of the furnace and a metal ring positions about a scavenger face. The return exhaust tube connects back into the scavenger area of the furnace. An alternative embodiment illustrates a configured bellows closure door at one end of a moveable stainless steel or quartz elephant tube which seals against a process tube of a wafer processing furnace and a configured bellow doors about one end of the cantilevered paddle for providing a pressure tight or vacuum tight environment for chemical vapor deposition (CVD) processes.

21 Claims, 16 Drawing Sheets

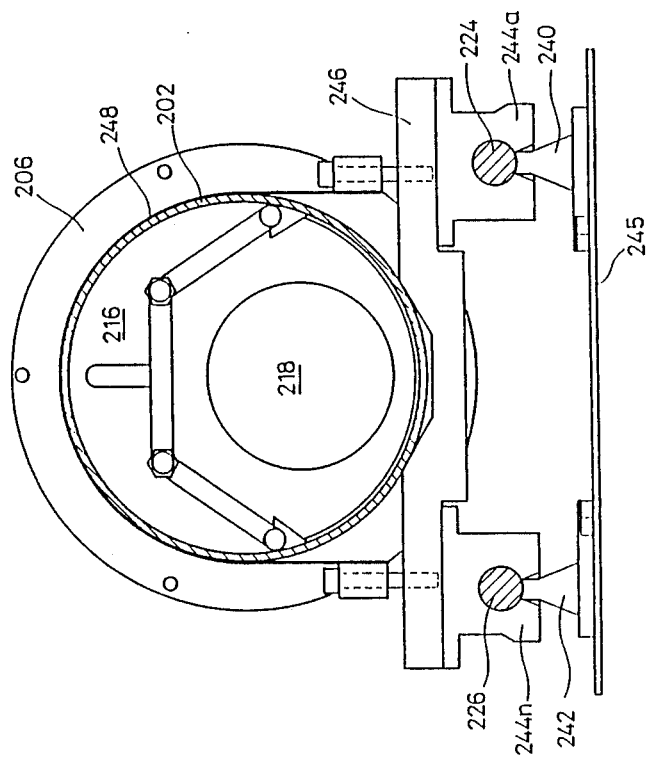

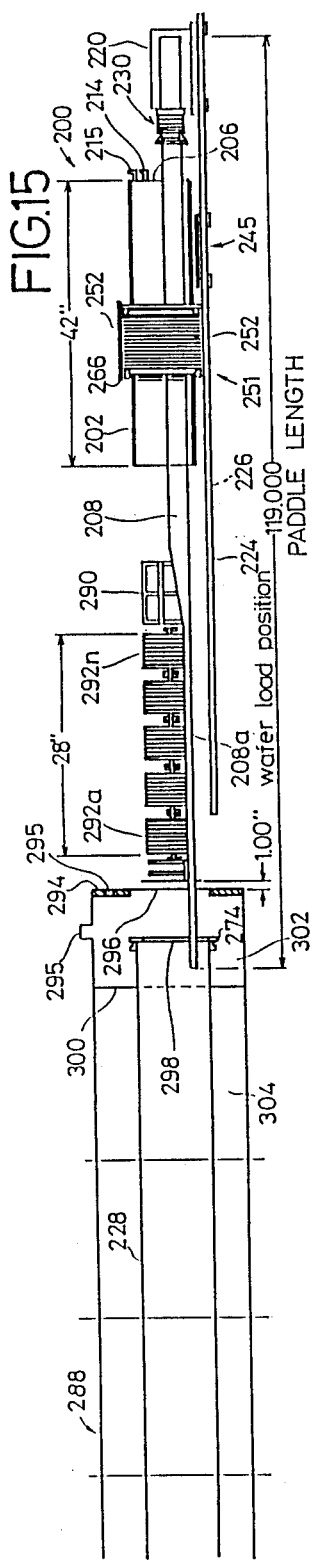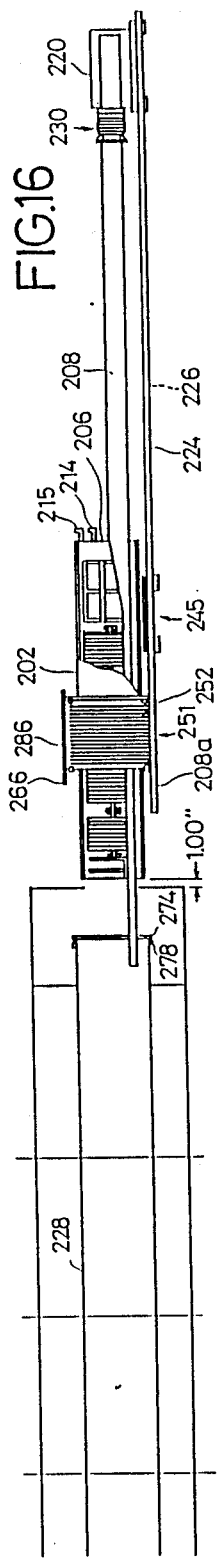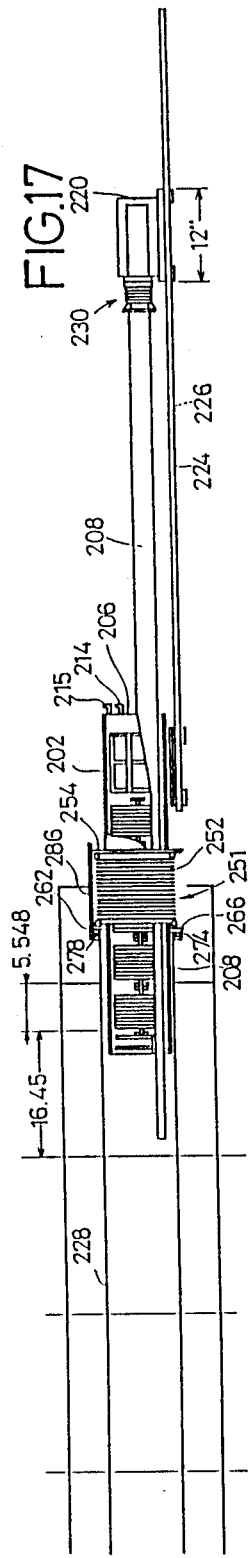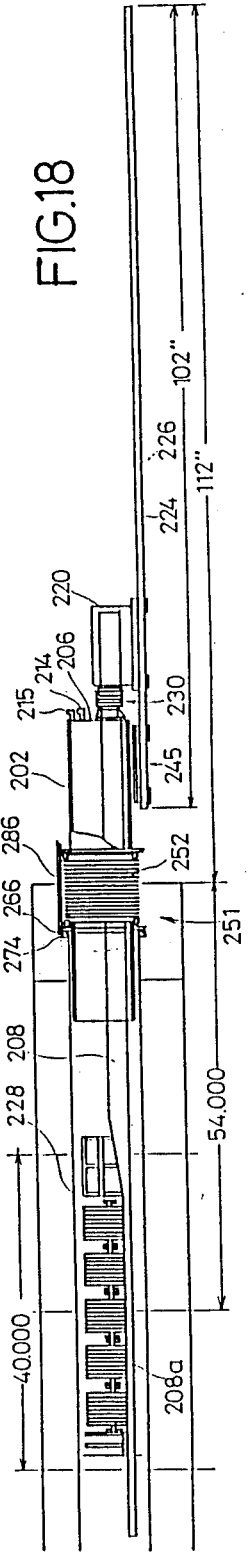

PURGE CANTILEVERED WAFER LOADING SYSTEM FOR LP CVD PROCESSES

CROSS REFERENCES TO CO-PENDING APPLICATIONS

This patent application is a continuation-in-part of U.S. Ser. No. 07/279,844, filed Dec. 5, 1988, pending entitled "Moveable Cantilevered Purge System", by Cleon R. Yates, and assigned to the same assignee.

BACKGROUND OF THE INVENTION

1. Field of the Invention - The present invention pertains to semiconductor processing systems, and more particularly, pertains to a movable cantilevered purge system including a movable quartz elephant tube with a paddle for use between a wafer load position, a wafer purge position, and a wafer process position for a substrate processing furnace.

2. Description of the Prior Art - Prior art systems have either provided a wafer load position or a wafer process position, but have not provided for an adequate purging position between the other two positions.

U.S. Pat. No. 4,459,104 to Wollmann, entitled "Cantilevered Diffusion Tube Apparatus and Method"; and U.S. Pat. No. 4,526,534 to Wollmann, entitled "Cantilevered Diffusion Tube Apparatus and Method" each have slots in the bottom of the process tubes.

U.S. Pat. No. 4,543,059 to Whang et al., entitled "Slotted Cantilevered Diffusion Tube System and Method and Apparatus for Loading" describes a diffusion tube apparatus. The reference discloses a large quartz tube with a slot in the bottom. There is one glass sleeve inside the process tube. There are no bellows to support a paddle. The glass sleeve is supported on a single runaway and in close proximity to the process tube.

The present invention overcomes the disadvantages of the prior art by providing a movable elephant tube for use in a wafer load purge and wafer process position, and can include a purge injector and a return exhaust tube in the elephant tube. The moveable elephant tube provides for access to wafer loads and purging of the process tube including accelerated cooling cycles. The alternative embodiment provides for low pressure chemical vapor deposition (CVD) processes.

SUMMARY OF THE INVENTION

The general purpose of the present invention is to provide a movable cantilevered purge system including the use of a movable quartz elephant tube with sealing ring assembly, which seals a movable quartz elephant tube into a wafer processing furnace and about scavenger faces of the furnace.

According to one embodiment of the present invention, there is provided a movable cantilevered purge system including a movable quartz elephant tube positioned on bearing blocks on stainless steel shafts. A silicon carbide or ceramic paddle is supported in a cantilevered paddle clamping vehicle, also mounted on the stainless steel shafts. The stainless steel shaft assembly is positioned adjacent to a processing furnace and in alignment with a quartz process tube. The movable quartz elephant tube moves between a wafer load position, a wafer purge position, and a wafer processing position. The particular sealing arrangement of the quartz ring to the process tube and the stainless steel ring to the scavenger face, provide for a system in that the rings are provided with three degrees of movement and concentricity between the movable quartz elephant tube, the process tube, and the furnace by the doors.

According to an alternative embodiment of the present invention, there is provided a moveable cantilevered purge system with a bellows style closure door which positionally aligns on one end of the moveable stainless steel elephant tube to engage and seal against a process tube in a wafer processing furnace. There is an additional bellow type door to seal the paddle at the end of the elephant tube resulting in a pressure tight or vacuum tight environment in the elephant chamber for low pressure chemical vapor deposition (CVD) processes.

Significant aspects and features of the present invention include a movable cantilevered purge system with a movable quartz elephant tube which includes a quartz door sealing against a wafer processing tube, and a metal door sealing against the scavenger face where the doors are sealed with concentricity with respect to the tubes. There is also a seal made between the scavenger face and the return exhaust for venting of any gases. This also provides a workable system preventing back-streaming of gases.

Another significant aspect and feature of the present invention is an elephant tube which slides between a wafer load position, a wafer purge position, and a wafer process position. The elephant tube and supporting structure also provides for venting and expedited cooling and/or purging of gases through a return scavenger exhaust tube. Based on the sealing arrangements, there is no, or very minimal, backstreaming of atmospheric gases from the room into the elephant tube.

A further significant aspect and feature of the present invention is a movable cantilevered purge system which provides for an atmospheric controlled environment such as for vapor deposition processes. The atmosphere can also be purged such as with an inert gas.

An additional significant aspect and feature of the alternative embodiment of the present invention is a moveable cantilevered purge system which utilizes at least: one internal injector which has a plurality of holes.

Still another significant aspect and feature of the alternative embodiment of the present invention are self-aligning bellows closure doors.

Yet another significant aspect and feature of the present invention is the use of bellow doors about an elephant tube and about a cantilevered paddle for establishing a pressure seal or vacuum seal for low pressure chemical vapor deposition (CVD) processes.

Having thus described principal embodiments of the present invention, it is a principal object hereof to provide a movable cantilevered purge system including the use of an elephant tube with at least one, preferably two, injector nozzles riding on a track or rail system.

One object of the present invention is a movable elephant tube between various positions and along the shaft of a paddle handle such as a Norton paddle.

Another object of the present invention is an elephant tube assembly which forms an airtight seal about the surrounding structure to prevent the escape of gases and prevent the back-streaming of gases. Depending upon the operational parameters, temperatures and pressures, there may be a very minute amount of gas escaping or back-streaming, but if so, such is very minimal.

A further object of the present invention is to provide a low pressure CVD system using bellow doors to establish a pressure seal or a vacuum seal environment.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 14 illustrates an end view in cross section of the moveable cantilevered purge system taken along line 14—14 of FIG. 12;

FIG. 15 illustrates the alternative embodiment mode of operation of the wafer load position of the moveable cantilevered purge system in partial cross section;

FIG. 16 illustrates the alternative embodiment mode of operation in the wafer purge position A:

FIG. 17 illustrates the alternative embodiment mode of operation in the wafer purge position B:

FIG. 18 illustrates the alternative embodiment mode of operation in the wafer process position; and, FIG. 19 illustrates a perspective view of the alternative embodiment of FIG. 12.

DESCRIPTION OF THE PREFERRED EMBODIMENTS

Figure 1:
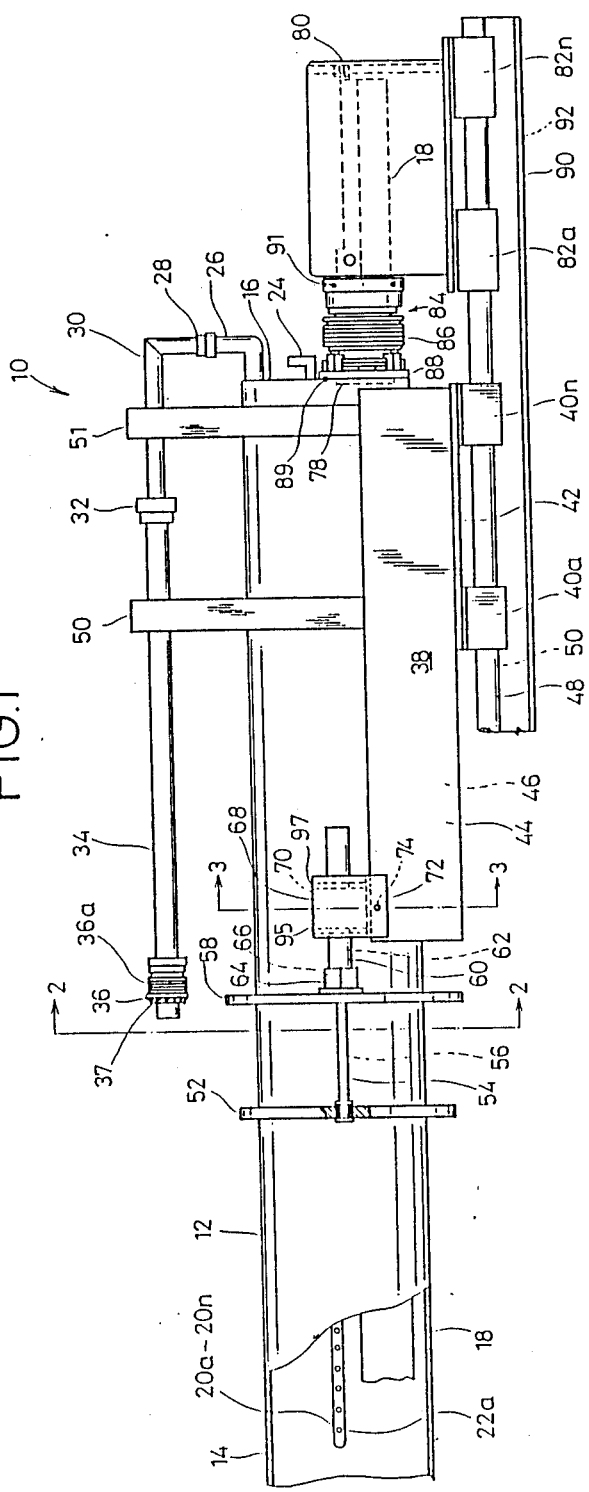
FIG. 1 illustrates a side view of a movable cantilevered purge system, the present invention.
Figure 2:
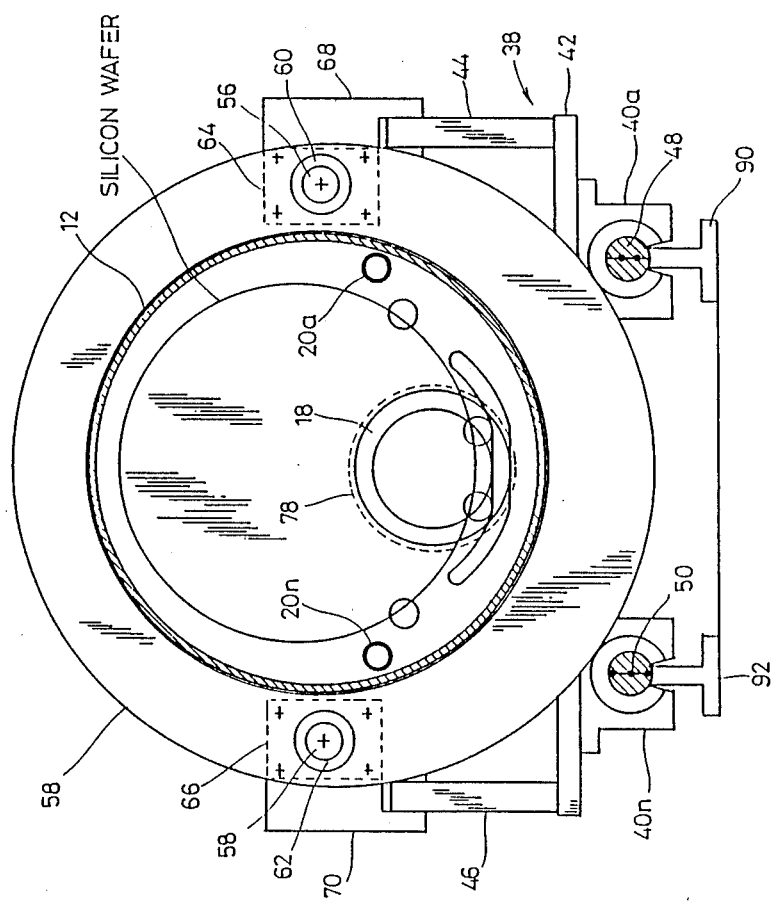
FIG. 2 illustrates an end view in cross section of the movable cantilevered purge system taken along line 2—2 of FIG. 1.
Figure 6:
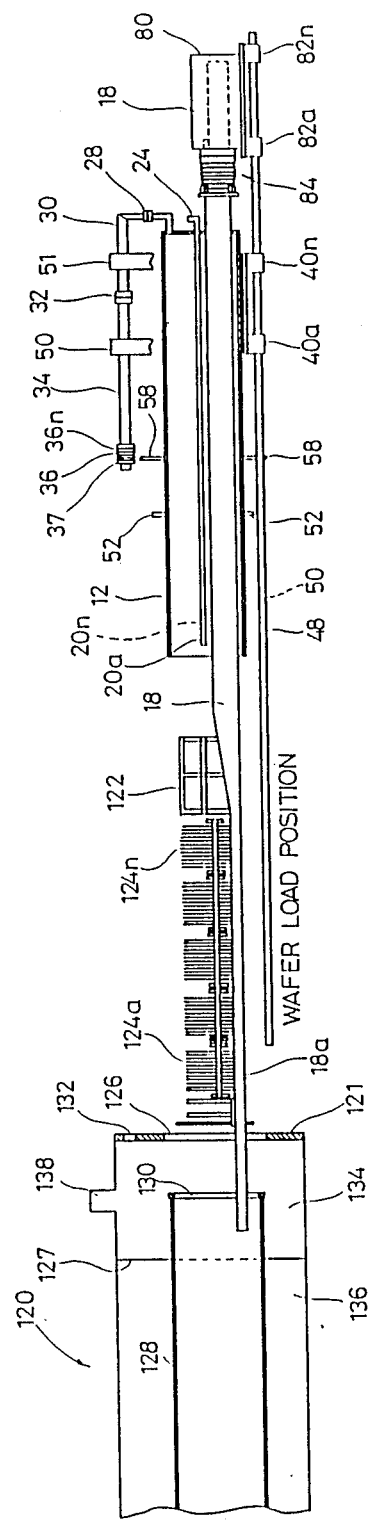
FIG. 6 illustrates the mode of operation of the wafer load position of the movable cantilevered purge system in partial cross section.

FIG. 1 illustrates a side view of a movable cantilevered purge system 10 including a movable quartz elephant tube 12. The movable quartz elephant tube 12 can be of varying diameters and lengths according to specific load requirements and wafer size. The movable quartz elephant tube 12 includes one open end 14, and an opposing end 16 which can be partially closed with an opening in the partially closed end 16 of sufficient size and shape to allow a silicon carbide or ceramic paddle support shaft or handle 18 to pass through the minimal clearance of about 70 thousands of an inch and in a range of 10-100 thousands of an inch. Also, the movable quartz elephant tube 12 can include a plurality of one or more nitrogen purge injectors 20a-20n located and fixed to the inner wall of the movable quartz elephant tube 12 at strategic points so as to pass nitrogen or other gases across wafer surfaces for such purposes as removing oxygen from the atmosphere. The movable quartz elephant tube 12 can also have a plurality of one or more connecting nipples for the purpose of attaching gas passing apparatus structure. A plurality of one or more holes 22a-22n of varying sizes and center-to-center spacings are located in the nitrogen purge injectors 20a-20n for the purpose of passing nitrogen or other gases across the surface of silicon wafers as illustrated in FIG. 2. A quartz exhaust nipple 24 positions on the partially closed end 16 of the movable quartz elephant tube 12 onto which a gas source can be attached. The quartz exhaust nipple 24 connects to the purge injector tubes 20a-20n. A quartz exhaust nipple 26 is constructed of quartz tubing and seals directly to the interior of the movable quartz elephant tube 12 for the purpose of attaching an airtight O'ring compression connector and flange assembly 28. A stainless steel connector elbow 30 connects to the other end of the airtight O'ring compression connector 28 and to airtight O'ring compression connector 32. The stainless steel connector elbow 30 is constructed of stainless steel or other like materials, and provides a vacuum-tight connection between the movable quartz elephant tube 12 via the quartz exhaust nipple 26, the airtight O'ring compression connectors 28 and 32, and a straight section of stainless steel return scavenger exhaust tube 34. This provides the piping for which to route exhaust gases that may exit from the furnace scavenger area. Brackets 49 and 51 secure the elephant tube 12 to the elephant carrier vehicle 38 and also support the return scavenger exhaust tube 34. A closure door 36 for the return scavenger exhaust tube 34 is constructed of stainless steel or other like materials, combines a stainless steel flexible joint 36a in cooperation with stainless steel sealing door 58, and attaches to the stainless steel scavenger exhaust tube 34. The closure door 36 provides a substantially airtight sealing between the scavenger face 121 and the stainless steel return scavenger exhaust tube 34 when in the purge or wafer process position. A compression type airtight O'ring 37 positions adjacent to the end of the closure door 36 to subsequently seal over return scavenger exhaust hole 132 of the scavenger face 121 as illustrated in FIG. 6. A quartz sealing door 52 of sufficient inner and outer diameter and thickness is located concentrically over and about the movable quartz elephant tube 12. The quartz sealing door 52 is supported by two or more horizontally aligned quartz slide rods on opposing sides of the elephant carrier vehicle 38, and provides a tight seal between the movable quartz elephant tube 12 and the process tube when the movable quartz elephant tube 12 is in the purge or wafer process position. A stainless steel sealing door 58, constructed of stainless steel or other like material of sufficient inner and outer diameter and thickness, is located concentrically over and about the movable quartz elephant tube 12, is supported by two or more horizontally aligned cylindrical tubes 60 and 62, and provides a seal between the movable quartz elephant tube 12 and external portion of the scavenger exhaust area when the movable quartz elephant tube 12 is in the purge position or wafer process position. Mounting flanges 64 and 66, constructed of stainless steel or other like material, are located concentrically on cylindrical tubes 60 and 62 for the purpose of attaching and securing stainless steel sealing door 58. Pivotal adjusting blocks 68 and 70, made of stainless steel or other like material, are located and attached to opposing sides of the elephant carrier vehicle 38, and provide support means for the quartz slide rods 54 and 56 and cylindrical tubes 60 and 62 while offering both vertical and angular pivotal adjustments to the quartz sealing door 52 and the stainless steel scavenger sealing door 58. The cylindrical tubes 60 and 62, made of stainless steel or other like material, are located and attached to the pivotal adjusting blocks 68 and 70, have one end open and the other end closed providing an enclosed housing for stainless steel springs, and one or more Teflon concentric cylindrical spacers. Teflon spacers maintain concentricity between quartz slide rods 54 and 56 and cylindrical tubes 60 and 62, respectively, and also provide slidability when the quartz sealing door 52 concentrically contacts the process tube during the purge or wafer process cycles. The stainless steel springs allow flexibility of quartz slide rods 54 and 56, assuring proper engagement and tension of quartz sealing door 52 during the purge or wafer process cycles. Pivotal pins 72 and 74 provide axis to pivotal adjusting blocks 68 and 70 located on opposing sides of the elephant carrier vehicle 38 and above opposing sides of the movable quartz elephant tube 12 when adjustments are made so as to achieve concentricity between quartz sealing door 52 and movable quartz elephant tube 12, the stainless steel sealing door 58, and movable quartz elephant tube 12. Reference to the quartz sealing doors, quartz slide rods, cylindrical tubes, stainless steel springs, Teflon spacers and the pivot blocks is made in a copending U.S. Pat. application Ser. No. 423,343, filed Oct. 18, 1989, entitled "Atmospheric Door Closure" by the same inventor and assigned to the same assignee. A paddle hole 78 is located in partially closed end 16 of movable quartz elephant tube 12 and provides a passageway through which the silicon carbide paddle support shaft 18 passes. The size and configuration of partially closed hole 16 varies according to the particular silicon carbide paddle size. A cantilevered paddle clamping vehicle 80 is constructed of aluminum which can be hard stainless steel or other like materials, and is supported by a plurality of one or more bearing blocks 82a-82n which provides smooth travel on the parallel stainless steel shafts 48 and 50. The cantilevered paddle clamping vehicle 80 secures and supports the silicon carbide paddle support shaft 18. The cantilevered paddle clamping vehicle 80 also provides for alignment of the paddle with respect to the process tube and other components. The cantilevered paddle clamping vehicle 80 also provides adjustments, both vertical and lateral, to the silicon carbide paddle support shaft 18 assuring alignment between the silicon carbide paddle support shaft 18, the movable quartz elephant tube 12 and process tube as previously referenced in the co-pending patent application. A closure door 84 for the movable quartz elephant tube 12 is constructed of stainless steel or other like materials, and attaches directly to silicon carbide paddle support shaft 18 via a compression type airtight O'ring type seal 91 of suitable material. The closure door 84 is comprised of stainless steel flexible bellows 86 attached to a sealing plate 88 which may have an optional compression type airtight O'ring 89 of a suitable material, which engages with end 16 of the movable quartz elephant tube 12, and assures a substantially airtight sealing between the silicon carbide paddle support shaft 18 and the movable quartz elephant tube 12 when in the purge or the wafer process position. Shaft supports 90 and 92, constructed of stainless steel or other like materials, provide structure for securing and supporting the stainless steel shafts 48 and 50 so that the bearing blocks 40a-40n and 82a-82n can ride smoothly along the shaft supports 90 and 92. An O'ring 89 seals the sealing plate 88 and the elephant tube end 16. Another O'ring 91 seals the closure door 84 about the silicon carbide paddle support shaft 18.

Figure 5:
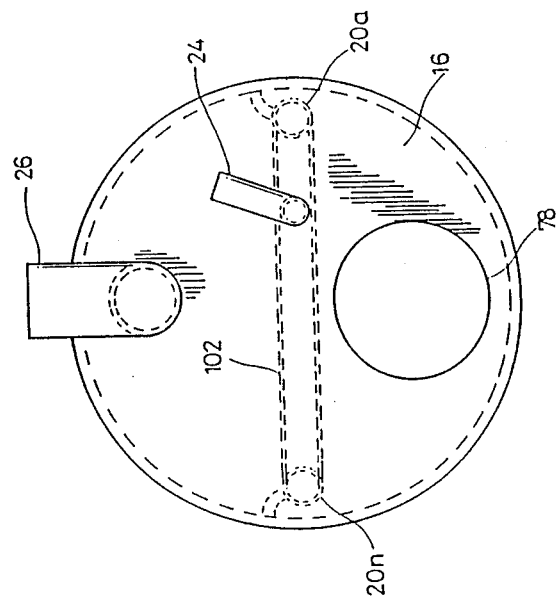
FIG. 5 illustrates an end view of the movable quartz elephant tube.

FIG. 2 illustrates an end view in cross section of the movable cantilevered purge system 10 taken along line 2—2 of FIG. where all numerals correspond to those elements previously described. Shown in particular is the stainless steel sealing door 58 concentric to and over and about the movable quartz elephant tube 12. The plurality of purge injectors 20a-20n are located as to provide for desired purging across substrate fronts, by way of example, of the inner side wall of the movable quartz elephant tube 12. Additional numbers of purge injectors 20a-20n can also be incorporated into the system. The purge injectors 20a-20n can be placed at other positions on the inner side walls than the positions illustrated, and can be manifolded together as illustrated in FIG. 5.

Figure 3:
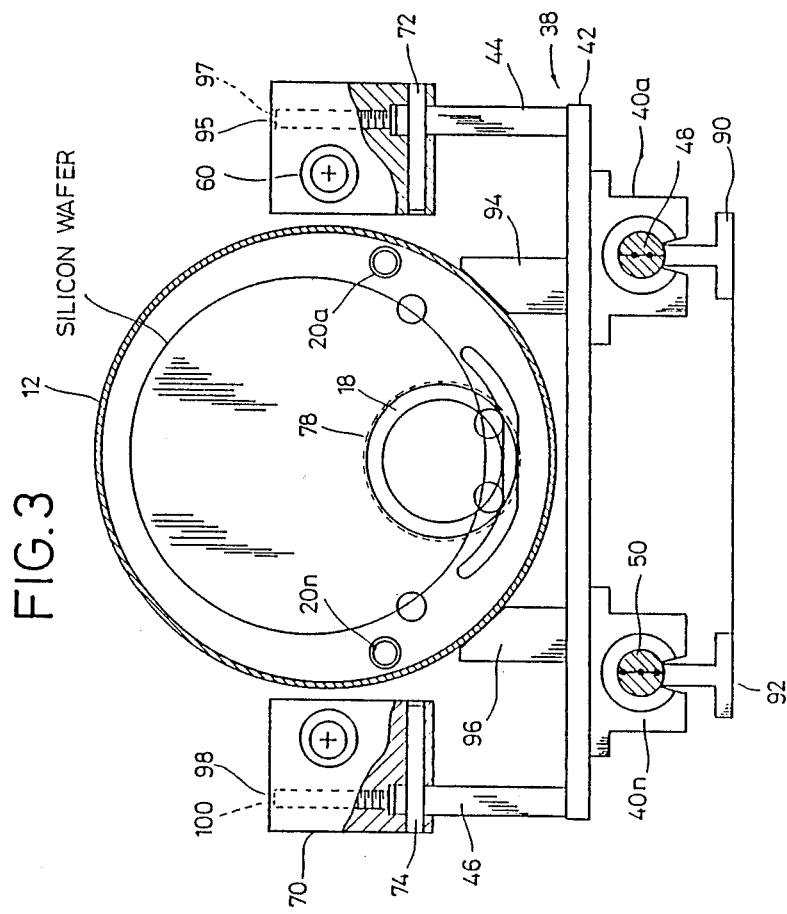
FIG. 3 illustrates an end view in cross section of the movable cantilevered purge system taken along line 3—3 of FIG. 1.

FIG. 3 illustrates an end view in cross section of the movable cantilevered purge system 10 taken along line 3—3 of FIG. 1 where all numerals correspond to those elements previously described. Longitudinal support members 94 and 96 extend vertically from the mounting plate 42 of the elephant carrier vehicle 38 to support the sides of the movable quartz elephant tube 12. The elephant carrier vehicle 38, including the movable quartz elephant tube 12, traverses on the plurality of bearing blocks 40a-40n and along the shafts 48 and 50. Shafts 48 and 50 are supported along the top portion of the shaft supports 90 and 92.

Pivotal pins 72 and 74 are illustrated in the pivotal adjusting blocks 68 and 70. Adjustment screws 95 and 97 in the pivotal adjusting block 68 and adjustment screws 98 and 100 in the pivotal adjusting block 70, as also illustrated partially in FIG. adjust to pivot the pivotal adjusting blocks 68 and 70 about the pivotal pins 72 and 74 so as to horizontally align the cylindrical tubes 60 and 62, the quartz slide rods 54 and 56 and stainless steel and quartz sealing doors 58 and 52. The sealing doors 52 and 58 act as concentric doors against the process tube and the scavenger face.

Figure 4:
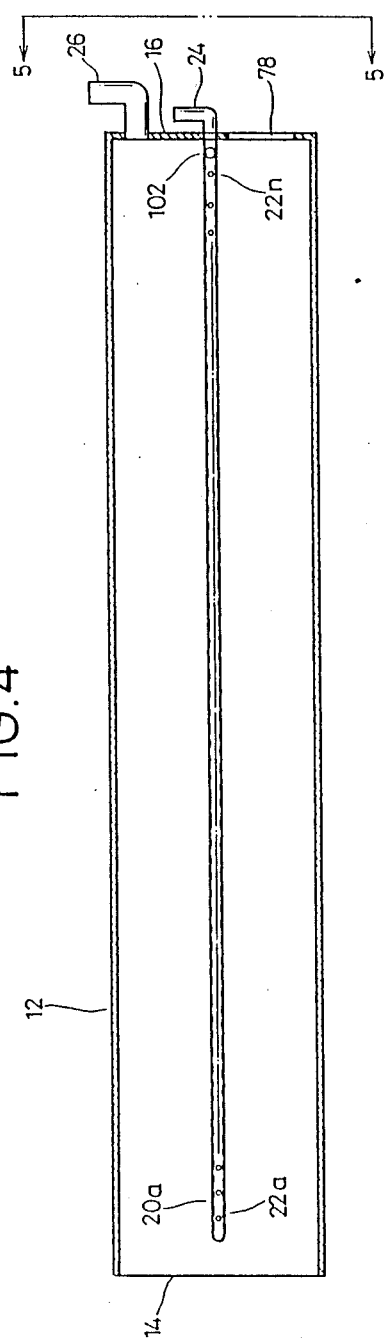
FIG. 4 illustrates a vertical cross section of a movable quartz elephant tube.

FIG. 4 illustrates a vertical cross section of the movable quartz elephant tube 12 where all numerals correspond to those elements previously described. Illustrated in particular is one of the purge injectors 20a secured to the inner wall of the movable quartz elephant tube 12. A manifold 102 connects the ends of the purge injector tubes 20a-20n adjacent to hole 22n of each injector tube as further illustrated in FIG. 5.

FIG. 5 illustrates an end view of the movable quartz elephant tube 12 along line 5—5 of FIG. 5 where all numerals correspond to those elements previously described. Manifold 102 is illustrated across the interior of the movable quartz elephant tube 12 connecting the nitrogen purge injectors 20a and 20n.

MODE OF OPERATION

Figure 7:
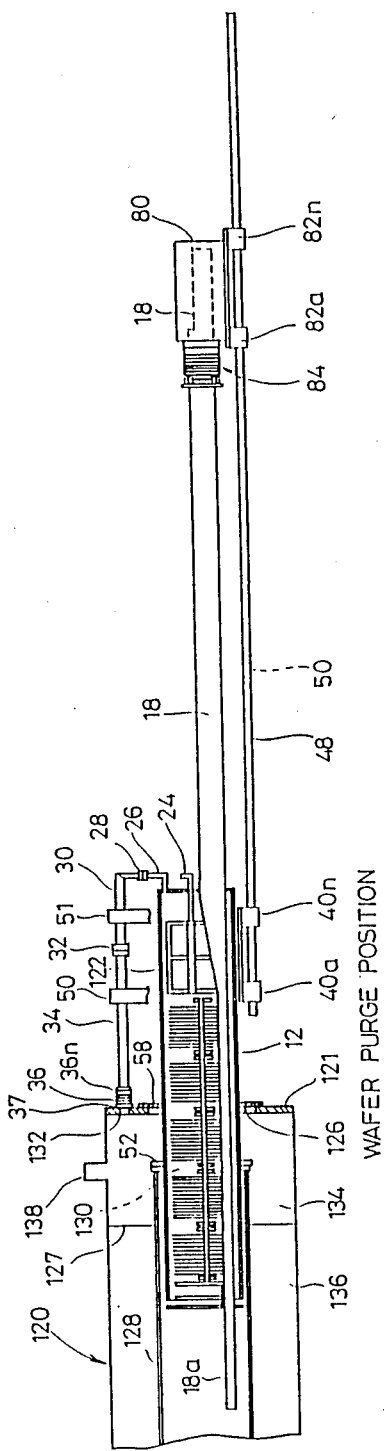
FIG. 7 illustrates the mode of operation of the wafer purge position.
Figure 8:
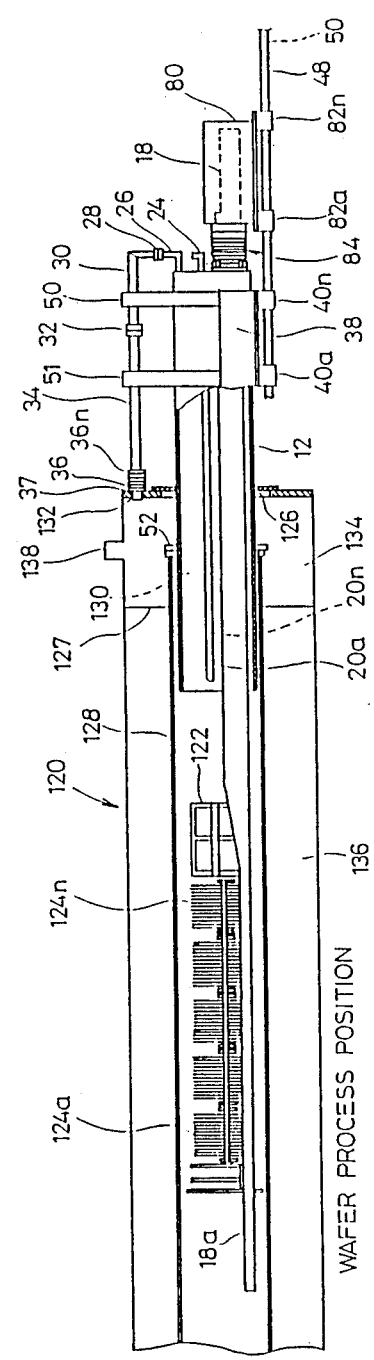
FIG. 8 illustrates the mode of operation of the wafer process position.

FIG. 6–8 best illustrate the mode of operation of the movable cantilevered purge system in conjunction with a wafer processing furnace.

FIG. 6 illustrates the movable cantilevered purge system 10 in partial cross section adjacent to a wafer processing furnace 120 in the wafer load position. All numerals correspond to those elements previously described. A wafer load zone 18a of the paddle extends from a midpoint of the paddle to one end of the silicon carbide paddle support shaft 18. A wafer boat 122, ready for processing, contains a plurality of wafers 124a–124n residing on the loading zone 18a and is illustrated prior to processing. The wafer processing furnace 120 includes a scavenger face 121, a scavenger hole 126 in the scavenger face 121, a quartz process tube 128 and a process tube orifice 130. A scavenger wall 127 in the wafer processing furnace 120 separates the scavenger area 134 from the process area 136 within the process furnace 120. The diameter of the scavenger hole 126 is of a larger dimension than the diameter of the process tube orifice 130 to allow passage of the quartz sealing door 52 through the scavenger hole 126 to subsequently seal against the process tube orifice 130. The scavenger hole 126 aligns axially with and subsequently seals against the stainless steel seal door 58. In a like manner, the process tube orifice 130 aligns axially with and subsequently seals against the quartz sealing door 52. A return scavenger exhaust hole 132 in the scavenger face 121 of the wafer processing furnace 120 aligns with the return scavenger exhaust tube 34, the closure door 36 and flexible joint 36a. The return scavenger exhaust hole 132 can be optionally added to the scavenger hole 126. A scavenger exhaust hole 138 is located on the wafer processing furnace 120 adjacent to the scavenger area 134.

FIG. 7 illustrates the wafer purge position where all numerals correspond to those elements previously described. The elephant carrier vehicle 38, illustrated in FIG. and the cantilevered paddle clamping vehicle 80 slidingly position along the stainless steel shafts 48 and 50 in a coordinated fashion so that the movable quartz elephant tube 12 and associated members are positioned partially within and seal against the wafer processing furnace 120 and the quartz process tube 128 for purging. As previously described, the wafer processing furnace 120 is sealed by the mating and engagement of the stainless steel sealing door 58 with the furnace scavenger face 121. The quartz process tube 128 is sealed by the mating and engagement of the quartz sealing door 52 with the process tube orifice 130. The closure door 36, including the flexible joint 36a, seals the return scavenger exhaust tube 34 projecting through the return scavenger exhaust hole 132 and thus with the furnace scavenger area 134 of the wafer processing furnace 120. The quartz sealing door 52 and the stainless steel sealing door 58 seal in a sequenced manner to seal the movable quartz elephant tube 12 to the scavenger face 121 and the quartz process tube 128. Initially, the spring cushioned quartz sealing door 52 mates with process tube orifice 130 of the process tube 128 and compresses internal springs in the pivotal adjusting blocks 68 and 70. Subsequently, the stainless steel sealing door 58 positions against the scavenger face 121 of the wafer processing furnace 120 as the elephant carrier vehicle 38, illustrated in FIG. 1, is moved further to the left. Pressurized nitrogen or other gas is introduced into the quartz exhaust nipple 24, and enters the interior of the sealed movable quartz elephant tube 12 through the purge injectors 20a–20n illustrated in FIGS. 1, 2, 4 and 5. Spent gases are purged from the sealed movable quartz elephant tube 12 through the quartz exhaust nipple 26, through the airtight O'ring compression connector 28, the stainless steel connector elbow 30, the airtight O'ring compression connector 32, and through the return scavenger exhaust tube 34 into the furnace process area 136 of the wafer processing furnace 120.

FIG. 8 illustrates the wafer processing position where all numerals correspond to those elements previously described. After purging of the movable quartz elephant tube 12, the cantilevered paddle clamping vehicle 80 is further positioned to the left and toward the elephant carrier vehicle 38 to position the wafer loading zone 18a containing the wafers 124a–124n fully into the interior of the quartz process tube 28 for wafer processing. The elephant carrier vehicle 38 and its associated components remain stationary as the silicon carbide paddle support shaft 18 passes to the left through the paddle hole 78 illustrated in FIG. 2.

After processing of the wafers 124a–124n in the quartz process tube 128, the wafer loading zone 18a and the movable quartz elephant tube 12 are withdrawn in reverse order from the quartz process tube 128 and the wafer processing furnace 120 by the sequenced movement of the elephant carrier vehicle 38 and the cantilevered paddle clamping vehicle 80 along the parallel stainless steel shafts 48 and 50.

Figure 9:
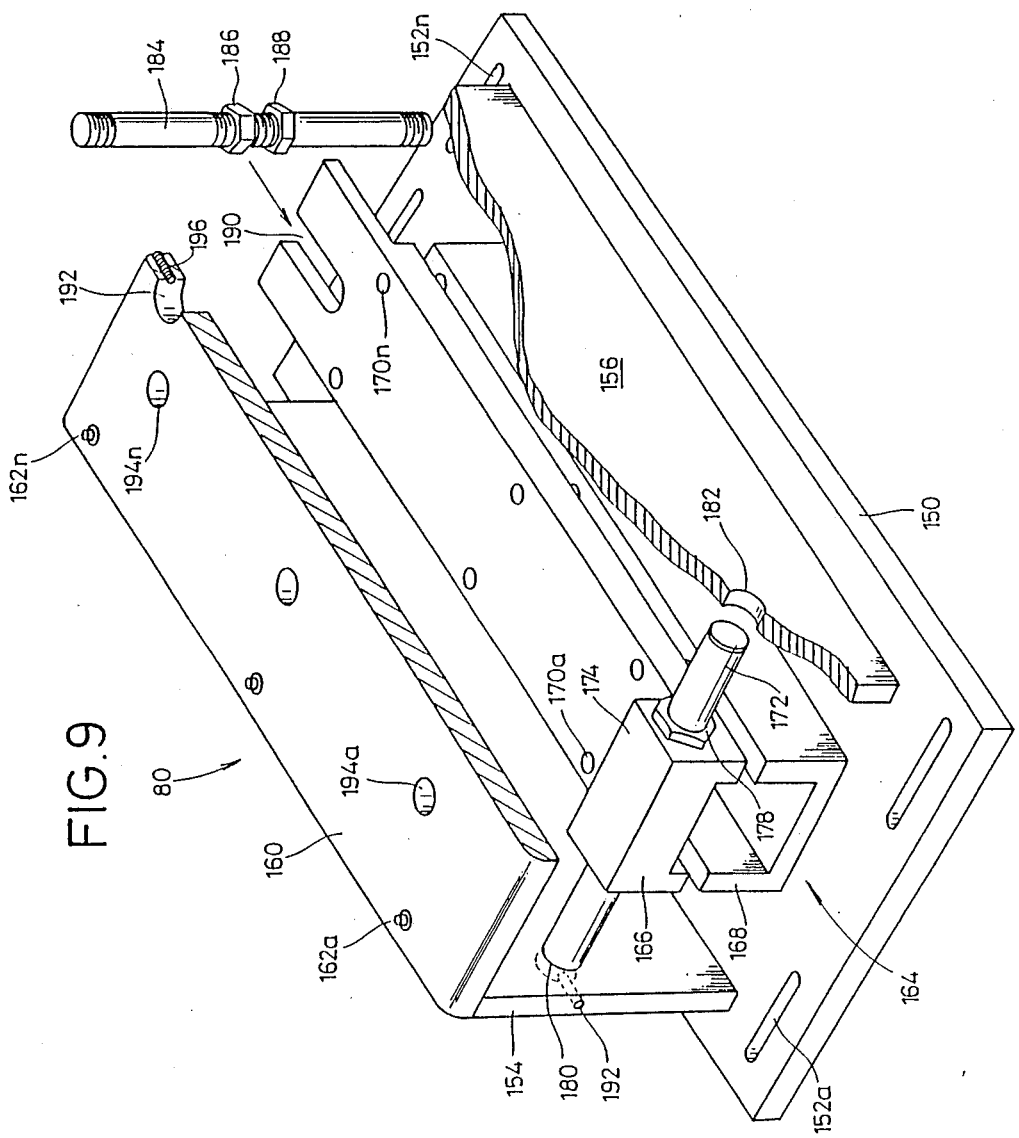
FIG. 9 illustrates a perspective view of the cantilevered paddle clamping vehicle.
Figure 10:
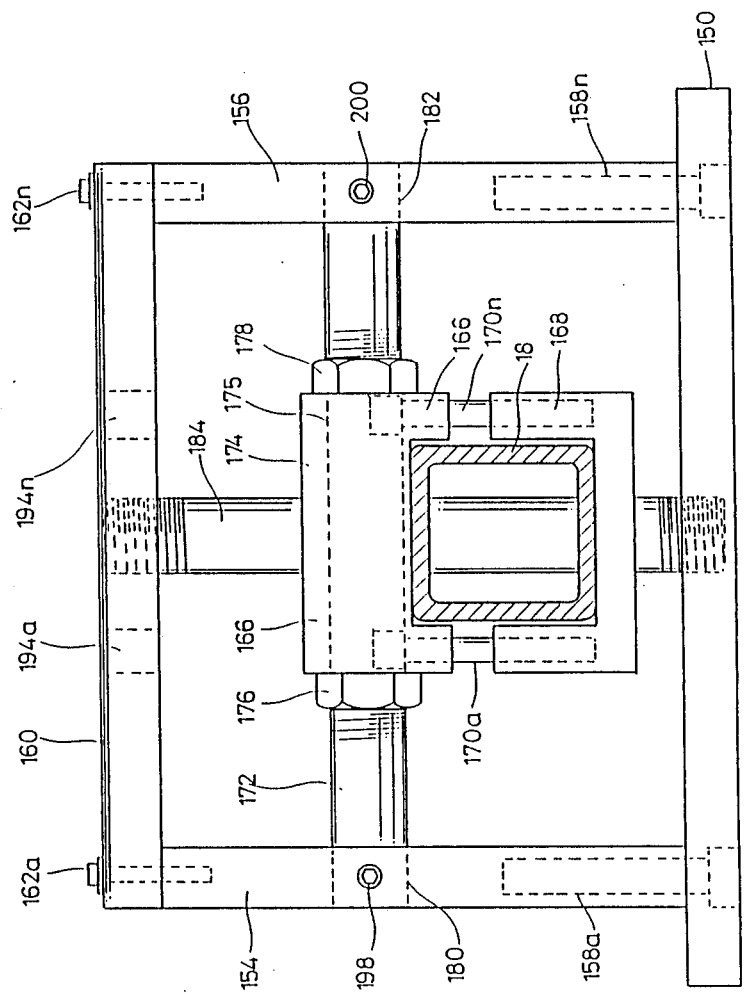
FIG. 10 illustrates an end view of the cantilevered paddle clamping vehicle.
Figure 11:
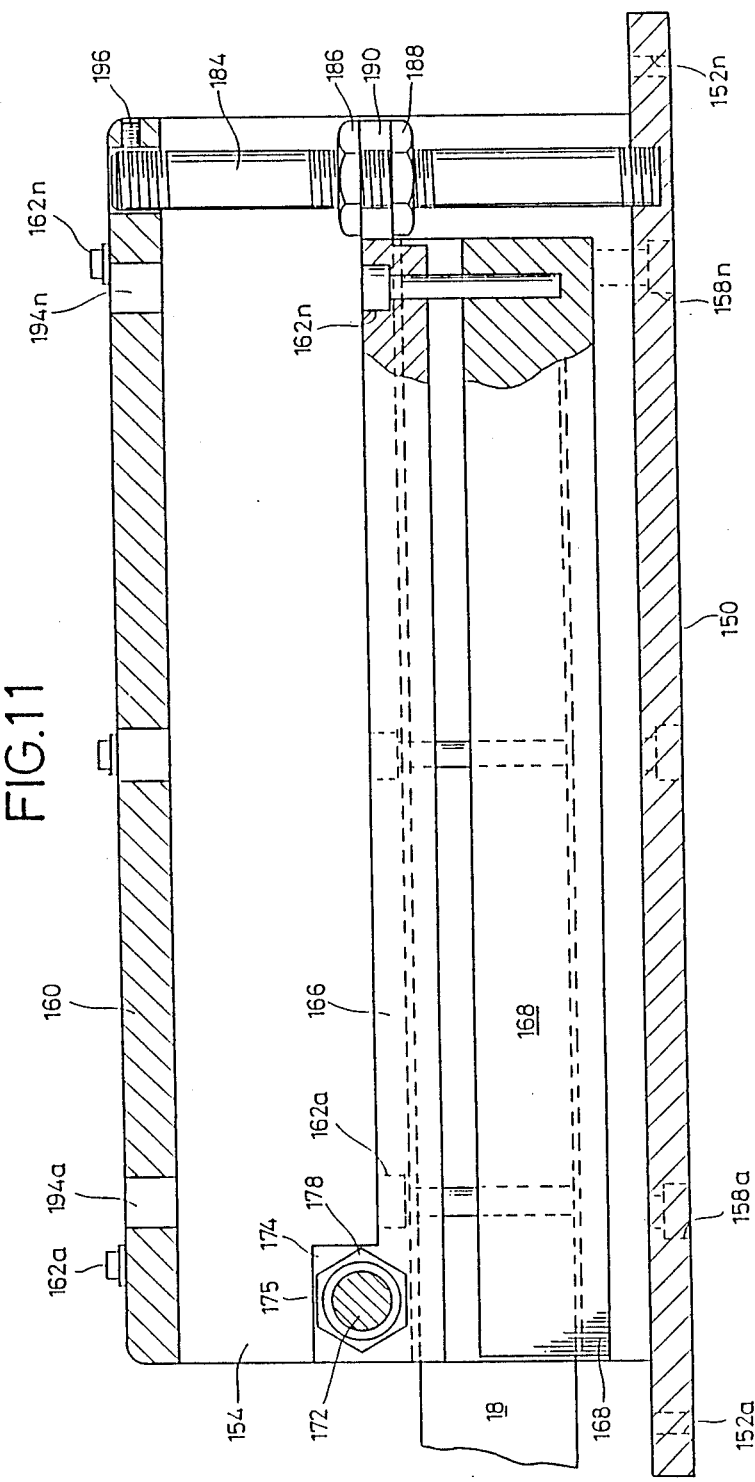
FIG. 11 illustrates a cross-sectional view of the cantilevered paddle clamping vehicle.

FIG. 9 illustrates a perspective view of the cantilevered paddle clamping vehicle 80 where all numerals correspond to those elements previously described. A rectangular base plate 150 includes a plurality of slotted adjustment holes 152a–152n and secures to the bearing blocks 82a–82n of FIG. by appropriate machine screw fasteners through the slotted adjustment holes 152a–152n. Parallel vertical side members 154 and 156 extend perpendicularly from the base plate 150 and are secured thereto by fasteners 158a–158n as illustrated in FIG. 10. A top plate 160 is secured to the vertical side member 154 and 156 by a plurality of fasteners 162a–162n. A pivoting clamp assembly 164 includes an upper channeled clamp member 166 and a lower channeled clamp member 168. The upper and lower channeled clamp members 166 and 168 are aligned with their channeled sides facing each other and are secured together over the silicon carbide paddle support shaft 18 by a plurality of fasteners 170a–170n as illustrated in FIG. 10. A pivotal shaft 172 secures through a hole 175 in a raised rectangular solid member 174 of the upper channeled clamp member 166 and is adjusted and secured thereto by jam nuts 176 and 178 illustrated in FIG. 10. The pivotal shaft 172 aligns in and pivots within holes 180 and 182 in side members 154 and 156. A vertically aligned threaded adjustment rod 184, including jam nuts 186 and 188, aligns in an open slotted hole 190 in one end of the upper channeled clamp member 166 and also aligns in a hole 192 in the top plate 160 as also illustrated in FIG. 11. A plurality of access holes 194a–194n align with the fasteners 170a–170n as illustrated in FIG. 11 to provide tool access to the fasteners 170a–170n so that upper and lower channeled clamp members 166 and 168 may be tightened over and about the silicon carbide paddle support shaft 18. A set screw 196 aligns horizontally with hole 192 in the top plate 160 to secure the upper end of the adjustment rod 184 within the hole 192. Lateral adjustment of the upper and lower channeled clamp members 166 and 168 with a silicon carbide paddle support shaft 18 secured therein is made by adjusting jam nuts 176 and 178 horizontally along the pivotal shaft 172 and against the sides of the raised rectangular solid member 174. Vertical elevational adjustment of the silicon carbide paddle support shaft 18 is provided by adjusting jam nuts 186 and 188 vertically along the adjustment rod 184 to cause the pivoting clamp assembly 164, including the upper and lower channeled clamp members 166 and 168 and the contained silicon carbide paddle support shaft 18 to pivot about the pivotal shaft 172. Upon attaining proper lateral and vertical elevational alignment of the silicon carbide paddle support shaft 18, set screw 196 is tightened against the upper portion of the adjustment rod 184, and the pivotal shaft 172 is secured in position by set screws 198 and 200 aligned horizontally in side members 154 and 156. Set screws 198 and 200 tighten perpendicularly against the end of the pivotal shaft 172 in holes 180 and 182.

FIG. 10 illustrates an end view of the cantilevered paddle clamping vehicle 80 clamped over the silicon carbide paddle support shaft 18. All numerals correspond to those elements previously described. Illustrated in particular are the jam nuts 176 and 178 which laterally position the pivoting clamp assembly 164.

FIG. 11 illustrates a side view in cross section of cantilevered paddle clamping vehicle 80. Illustrated in particular are the jam nuts 186 and 188 which elevationally position the pivoting clamp assembly 164 and the engaged silicon carbide paddle support shaft 18.

DESCRIPTION OF THE ALTERNATIVE EMBODIMENTS

Figure 12:
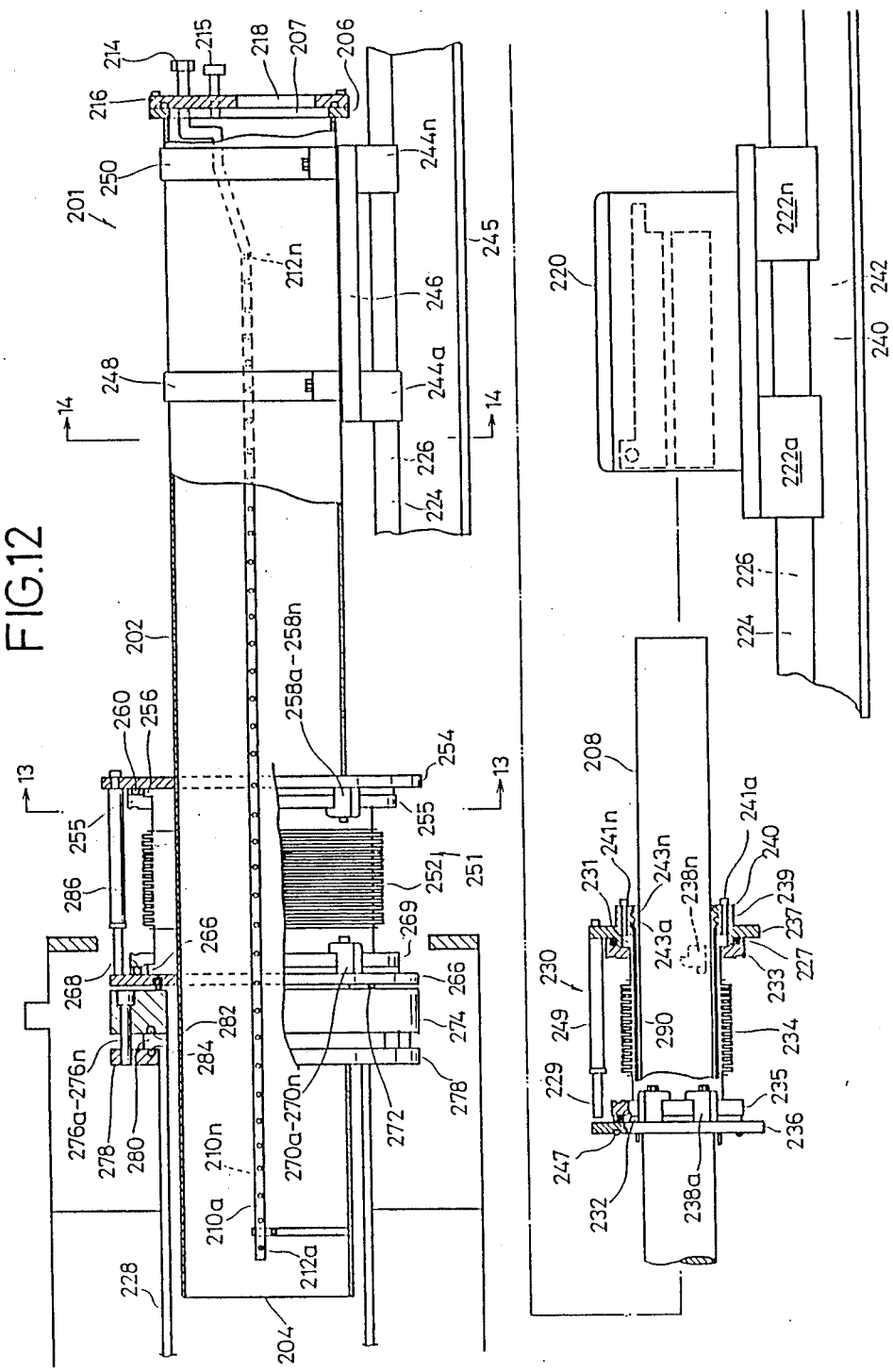
FIG. 12 illustrates an alternative embodiment in a side view of a moveable cantilevered purge system and where a perspective view is illustrated in FIG. 19.
Figure 13:
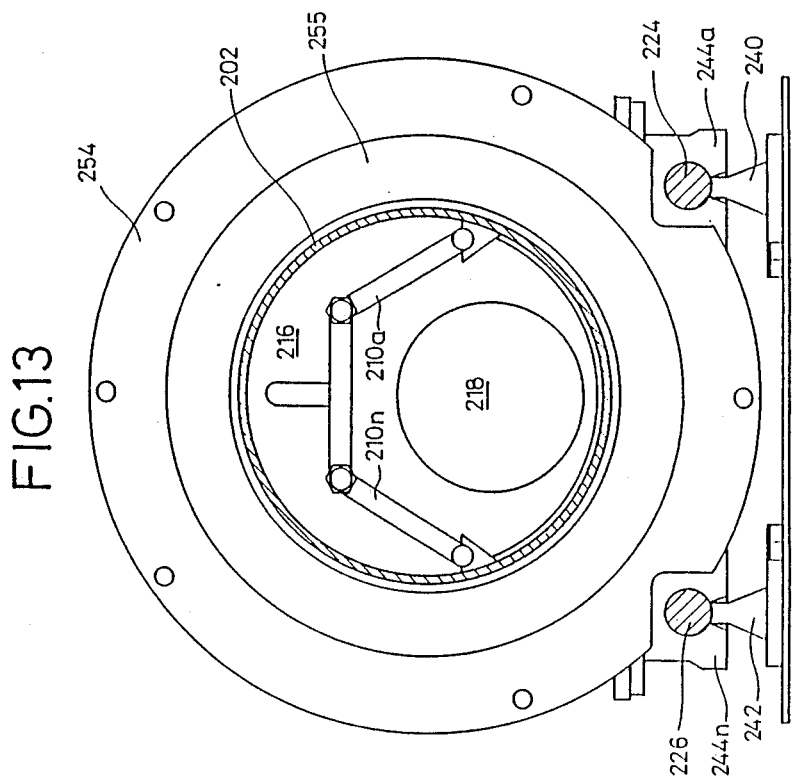
FIG. 13 illustrates an end view in cross section of the moveable cantilevered purge system taken along line 13—13 of FIG. 12.

FIG. 12 illustrates an exploded side view of a movable cantilevered purge system 201 including a movable stainless steel elephant tube 202. The movable stainless steel elephant tube 202 can be of varying diameters and lengths according to specific load requirements and wafer size. The movable stainless steel elephant tube 202 includes one open end 204, and an opposing end 206 which can be partially closed with an opening 207 in the partially closed end 206 of sufficient size and shape to allow a silicon carbide or ceramic paddle support shaft or handle 208 to pass through the minimal clearance of about 70 thousands of an inch and in a range of 10-100 thousands of an inch. Also, the movable stainless steel elephant tube 202 can include a plurality of one or more nitrogen purge injector tubes 210a-210n located and fixed to the inner wall of the movable stainless steel elephant tube 202 at strategic points so as to pass nitrogen or other gases across wafer or substrate surfaces for such purposes as removing oxygen from the atmosphere. The movable stainless steel elephant tube 202 can also have a plurality of one or more connecting nipples for the purpose of attaching gas passing apparatus structure. A plurality of one or more holes 212a-212n of varying sizes and center-to-center spacings are located in the nitrogen purge injector tubes 210a-210n as illustrated in FIG. 13 for the purpose of passing nitrogen or other gases across the surface of silicon wafers. A nipple 14 positions on the partially closed end 206 of the movable stainless steel elephant tube 202 onto which a gas source can be attached. The nipple 214 connects to the nitrogen purge injector tubes 210a-210n. A nipple 215 is located at the tube end 206 for evacuation of the stainless steel elephant tube 202 for monitoring O₂ or any other gas with a monitoring probe. An end plate 216 including a paddle hole 218 is located adjacent to the partially closed end 206 of movable stainless steel elephant tube 202. The silicon carbide, or other material such as ceramic, etc., paddle support shaft 208 passes through the paddle hole 218. The size and configuration of the paddle hole 218 in the end 206 varies according to the particular paddle size. A moveable cantilevered paddle clamping vehicle 220 similar to the cantilevered paddle clamping vehicle 80 of FIG. 1 is constructed of aluminum which can also be hard stainless steel or other like materials, and is supported by a plurality of one or more bearing blocks 222a-222n which provides smooth travel of the cantilevered paddle clamping vehicle 220 and the parallel stainless steel shafts 224 and 226. The cantilevered paddle clamping vehicle 220 secures and supports the silicon carbide paddle support shaft 208. The moveable cantilevered paddle clamping vehicle 220 also provides for alignment of the paddle support shaft 208 with respect to a process tube 228 and other components. The cantilevered paddle clamping vehicle 220 also provides adjustments, both vertical and lateral, to the silicon carbide paddle support shaft 208 assuring alignment between the silicon carbide paddle support shaft 208, the movable stainless steel elephant tube 202 and process tube 228. A closure door 230 for sealing of the paddle support shaft 208 against the movable stainless steel elephant tube 202 is constructed of stainless steel or other like materials, and secures coaxially over and about the silicon carbide paddle support shaft 208. Annular flanges 231 and 232 at opposing ends of the bellows are secured to the sealing plates 237 and 236 by ring plates 233 and 235 and by a plurality of clamps 238a-238n secured over the ring plates 233 and 235 and annular flanges 231 an 232. An additional tube 290 is welded to plate 237 and extends beyond the sealing door 236 as a sliding surface. The tube 290 is preferred, but can also be optional. An O'ring 227 is located between the ring plate 233 and the sealing plate 237, and another O'ring 229 is located between the ring plate 235 and the sealing plate 236. Circular flanges 239 and 240 with beveled inner surfaces are secured against the sealing plate 237 by a plurality of machine screws 241a-241n.

A plurality of O'rings 243a-243n are compressed by the beveled inner surfaces of the circular flanges 239 and 240 to firmly secure, mount and seal the door closure assembly 230 to the paddle support shaft 208. The bellows is essentially anchored to the paddle support shaft 208 by the circular flanges 239 and 240 and the O'rings 243a-243n. The bellows 234 flexes from this anchor area and allows the sealing plate 236 and an O'ring 247, both concentric to the paddle support shaft 208, to slide along the paddle support shaft 208 so that it can effect a seal against the end plate 216 of the elephant tube 202. An adjustable bellow stop 249 secures to the sealing plate 237, and is located between the sealing plate 237 and sealing plate 236 to adjust bellow movement. Shaft supports 240 and 242, constructed of stainless steel or other like materials, provide structure for securing and supporting the stainless steel shafts 224 and 226 so that the bearing blocks 244a-244n and 222a-222n can ride smoothly along the shaft supports 224 and 226. An elephant tube carrier 245 includes a mounting plate 246 secured over the bearing blocks 244a-244n with brackets 248 and 25 securing the stainless steel elephant tube 202 to the mounting plate 246 and also to the bearing blocks 244a-244n.

Another closure door 251 is similar to the closure door 230, and includes a stainless steel flexible bellows 252 secured over, about and to the stainless steel elephant tube 202 to provide a seal between the stainless steel elephant tube 202 and the process tube 228. A vertically aligned flat donut shaped mounting plate 254 secures by welding or other means to the stainless steel elephant tube 202. An annular flange 256 at one end of the stainless steel bellows 252 and an O'ring seal 260 are secured beneath a ring mounting plate 255 by a plurality of brackets 258a–258n secured to the mounting plate 254 and about and over the periphery of the ring mounting plate 255. At the opposing end of the bellows 252 another annular flange 266 and an O'ring 268 are secured beneath a ring mounting plate 269 by a plurality of brackets 270a–270n secured to the mounting plate 266, and about and over the periphery of the ring mounting plate 269. Plates 255 and 269 are a part of the bellows and are welded thereto to the bellows. The bellows 252 springs against the secured mounting plate 254. The annular flange 266 is not secured to the elephant tube 202 and moves freely with the bellows over the elephant tube 202. An O'ring 272 is located in an annular groove in the annular flange 266 to provide for a seal between the annular flange 266 and another flange 274 secured to the process tube 228 by a plurality of machine screws 276a–276n. The machine screws 276a–276n thread into circular plate 278 to draw the annular flange 274 and the circular plate 278 against an annular flange 280 which extends from an end of the process tube 228. An O'ring 282 in the gas ring 274 and an O'ring 284 in the circular plate 278 effect a seal against the annular flange 280. A horizontally oriented adjustable bellow stop 286 is secured to the upper portion of the mounting plate 254 to adjust compression of the stainless steel bellows 252.

FIG. 13 illustrates an end view in cross section of the movable cantilevered purge system 201 taken along line 13—13 of FIG. 12 where all numerals correspond to those elements previously described. Shown in particular is the closure door 251 concentric to, over and about the movable stainless steel elephant tube 202. The plurality of purge injector tubes 210a–210n are located as to provide for desired purging across substrate fronts, by way of example, of the inner side wall of the movable stainless steel elephant tube 202. Any additional number of purge injector tubes 210a–210n can also be incorporated into the system. The purge injector tubes 210a–210n can be placed at other positions on the inner side walls than the positions illustrated, and can be manifolded together.

FIG. 14 illustrates an end view in cross section of the movable cantilevered purge system 201 taken along line 14—14 of FIG. 12 where all numerals correspond to those elements previously described. Longitudinal shaft supports 240 and 242 extend vertically from the mounting plate 245 of the elephant carrier vehicle 245 to support the movable stainless steel elephant tube 202. The elephant carrier vehicle 245, including the movable stainless steel elephant tube 202, traverses on the plurality of bearing blocks 244a–244n and along the stainless steel shafts 224 and 226. Stainless steel shafts 224 and 226 are supported along the top portion of the shaft supports 240 and 242.

MODE OF OPERATION OF THE ALTERNATIVE EMBODIMENT

FIGS. 15–18 best illustrate the mode of operation of the movable cantilevered purge system in conjunction with a wafer processing furnace.

FIG. 15 illustrates the movable cantilevered purge system 201 in partial cross section adjacent to a wafer processing furnace 288 and in a wafer load position. All numerals correspond to those elements previously described. A wafer load zone 208a of the paddle extends from a midpoint of the paddle to one end of the paddle support shaft 208. Wafer boats 290a–290n, ready for processing, contains a plurality of substrates or wafers 292a–292n residing on the loading zone 208a and is illustrated prior to processing. The stainless steel elephant tube 202 on the elephant tube carrier 245 and the cantilevered paddle clamping vehicle 220 are positioned to the right on the stainless steel shafts 224 and 226. The wafer processing furnace 288 includes a scavenger face 294, a scavenger hole 296 in the scavenger face 294, a process tube 228 and a process tube orifice 298 centered in the flange 274. A scavenger wall 300 in the wafer processing furnace 288 separates the scavenger area 302 from the process area 304 within the wafer processing furnace 288. The diameter of the scavenger hole 296 is of a larger dimension than the diameter of the process tube orifice 298 to allow passage of the stainless steel bellows 252, and the associated peripheral components through the scavenger hole 296 to subsequently seal against the process tube 228 at the flange 274.

FIG. 16 illustrates the wafer purge position "A" where all numerals correspond to those elements previously described. The elephant tube carrier 245 along with the residing stainless steel elephant tube 202 are slidingly positioned to the left along the stainless steel shafts 224 and 226 and over the wafer loading zone 208a which contains a wafer boat 290 and a plurality of wafers 292a–292n, and is poised for entry of the wafer boats 290 and the wafers 292a–292n into the wafer processing furnace 288.

FIG. 17 illustrates the wafer purge position "B" where all numerals correspond to those elements previously described. The elephant tube carrier 245 containing the stainless steel elephant tube 202 about the wafer boat 290 and the wafers 292a–292n and the moveable cantilevered paddle clamping vehicle 220 are caused to be slidingly and simultaneously positioned to the left and along the stainless steel shafts 224 and 226 until the annular flange 266 of the stainless steel bellows 252 engages and seals against the flange 274 at the end of the process tube 228. The adjustable bellows stop 286 limits compression of the stainless steel bellows 252 between the mounting plate 254 and the annular flange 266. The elephant tube carrier 245 and the associated components remain stationary as the silicon carbide paddle support shaft 208 passes to the left through the paddle hole 218 as illustrated in FIG. 12. The cantilevered paddle clamping vehicle 220 with the attached closure door 230 and the paddle support shaft 208 with the contained wafer boats 290 with plurality of wafers 292a–292n continues the positional movement to the left to cause the wafer boat 290 and wafers 292a–292n to be positioned from the relative position inside the stainless steel elephant tube 202 into the flat zone or hot zone of the process tube 228 as illustrated in FIG. 18. Purging with gases ceases when the process position of FIG. 18 is reached.

FIG. 18 illustrates the closure door 230 engaging and effecting pressure tight or vacuum tight seal with the end of the tube 206 to seal the interior of the stainless steel elephant tube 202 from the ambient atmosphere in the area of the paddle hole 218 and a like seal by the closure door 251.

FIG. 18 illustrates the wafer process position where all numerals correspond to those elements previously described. The cantilevered paddle clamping vehicle 220 is illustrated as positioned fully to the left to cause the closure door 230 to seal against the stainless steel elephant tube 202 and to cause the paddle support shaft 208 to be positioned fully to the left thereby locating the wafer boat 290 and the plurality of wafers 292a–292n on the paddle support shaft 208 in the middle of the wafer processing furnace 288 for processing.

After processing of the wafers 292a–292n in the process tube 228, the wafer loading zone 208a and the movable stainless steel elephant tube 202 are withdrawn in reverse order from the process tube 228 and the wafer processing furnace 288 by the sequenced movement of the elephant tube carrier 245 and the cantilevered paddle clamping vehicle 220 along the parallel stainless steel shafts 224 and 226.

Figure 19:
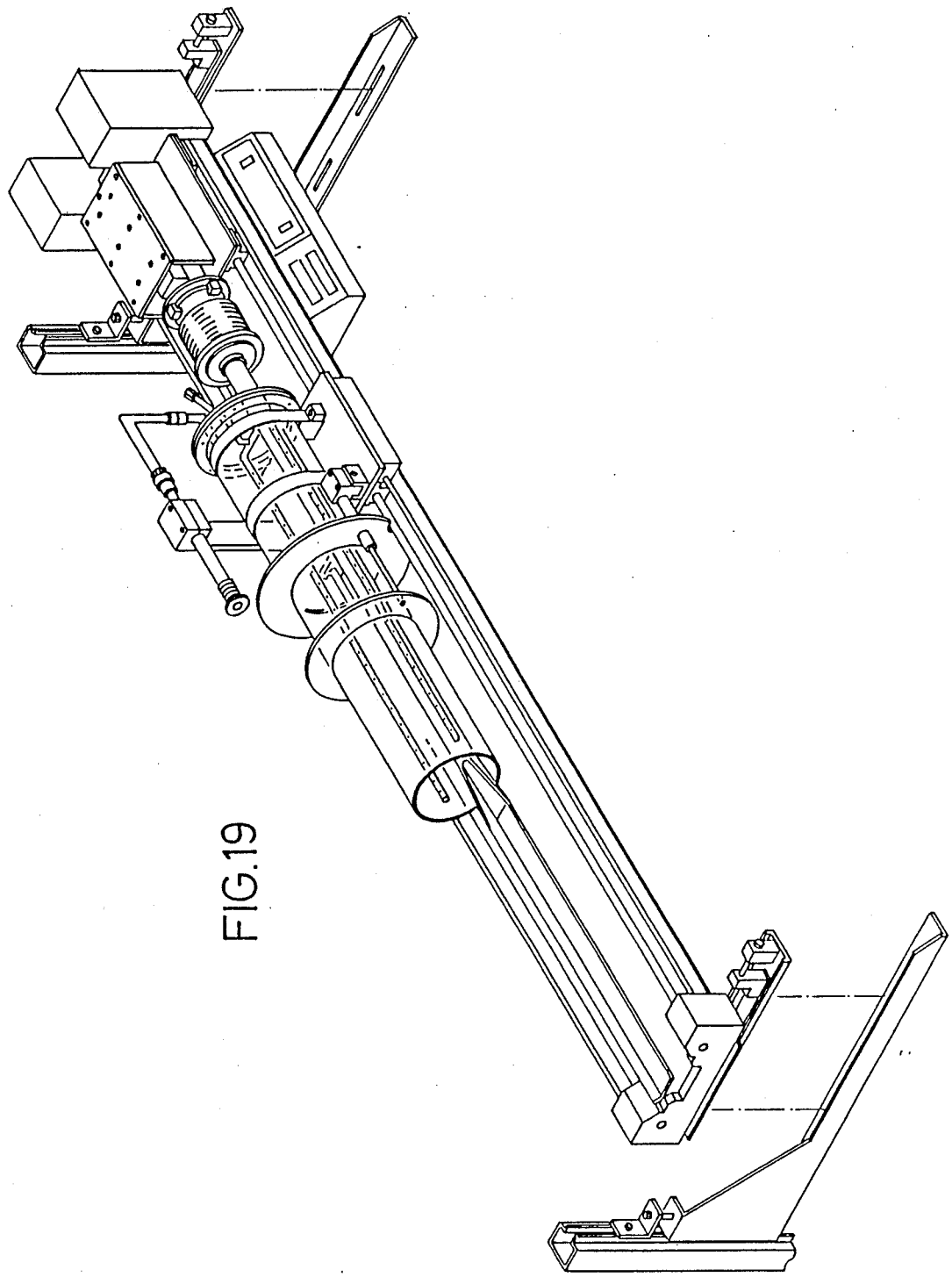

FIG. 19 illustrates a perspective view of the purge cantilevered substrate or wafer loading system for LP CVD processes on a support frame where all numerals correspond to those elements previously described. Two opposing frame members and associate structure support the opposing rails. Two outer opposing optional rails provide additional travel support for elephant tube carrier. Electronic microprocessor based controls are housed in a housing affixed to the frame.

Various modifications can be made to the present invention without departing from the apparent scope thereof.

The apparatus of the present invention can be utilized in any determined processes for processing of substrates or semiconductors and is not limited to LP CVD processes. The LP CVD process is by way of example and for purposes of illustration only and is not to be construed as the only process which can be practiced by the apparatus of the present invention. While a representative teaching of the arrangements of the components has been provided, the components can be assembled in accordance with the teachings of the present invention, particularly pertaining to the elephant tube and the door-bellows structure. The door-bellows structures can be utilized with other types of paddles or paddle clamping vehicles, and is not limited to the type of paddle and paddle clamping vehicle illustrated in the figures.

The elephant tube could be of quartz material rather than stainless steel as disclosed. Other materials can even be utilized besides quartz or stainless steel as may be determined by the processes and the state of materials, such as with new high technology materials.

I claim:

1. Elephant tube system for substrate processing comprising:
   a. rail means;
   b. elephant tube vehicle including means for travel on said rail means, and an elephant tube secured to said elephant tube vehicle, said elephant tube including a hole in an end for accepting a handle of a paddle; and,
   c. door-bellow means secured at one end to a midportion of said elephant tube.

2. System of claim 1 wherein said paddle vehicle door-bellows includes a forward sealing plate with an O'ring.

3. System of claim 2 wherein said paddle vehicle door-bellows includes a rearward sealing plate.

4. System of claim 1 wherein said elephant tube door-bellows means includes a forward plate.

5. System of claim 4 including at least one adjustable bellows stop coupled to said forward plate.

6. System of claim 1 including a gas introducing ring coupled to said elephant tube.

7. System of claim 1 including a purge nipple coupled to said elephant tube.

8. System of claim 1 including at least one injector tube internal to said elephant tube connected to said purge nipple.

9. System of claim 1 including a monitoring port nipple.

10. Substrate transport system comprising:
    a. frame means and opposing rail means supported on said frame means;
    b. paddle vehicle including means for travel on said rail means and a cantilevered paddle for supporting at least one substrate carrier;
    c. door-bellow means secured to a forward end of said paddle vehicle;
    d. elephant tube vehicle including means for travel on said rail means, and a stainless steel elephant tube secured to said vehicle means, said elephant tube including a hole in a rear end for accepting a handle of said paddle; and,
    e. door-bellow means secured at one end to a midportion of said elephant tube.

11. System of claim 10 wherein said paddle vehicle door-bellows includes at least one adjustable bellow stop.

12. System of claim 11 wherein said paddle vehicle door-bellows includes a tube connected from about said rearward sealing plate to a position slightly forward of said forward sealing plate.

13. System of claim 10 wherein said system is for LP CVD processes.

14. In combination, a semiconductor process tube and a substrate processing system comprising:
    a. a semiconductor process tube means for processing a plurality of substrates or wafers in gaseous environment; and,
    b. substrate processing system including frame means and opposing rail means supported on said frame means, paddle vehicle including means for travel on said rail means and a cantilevered paddle for supporting at least one substrate carrier, door-bellow means secured to a forward end of said paddle vehicle, elephant tube vehicle including means for travel on said rail means, and a stainless steel elephant tube secured to said vehicle means, said elephant tube including a hole in a rear end for accepting a handle of said paddle, and door-bellow means secured at one end to a mid-portion of said elephant tube.

15. Combination of claim 14 wherein said system is for LP CVD processes.

16. Process for processing of substrates in a CVD process tube of a semiconductor furnace comprising the steps of:
    a. loading a plurality of substrates onto a paddle at a substrate loading position;

b. positioning the substrates from a substrate loading position to a substrate purging position;

c. surrounding the paddle and substrates with an elephant tube with a door bellows means in a mid-portion thereof;

d. moving said elephant tube into sealing engagement with a process tube of a process furnace with a portion of said elephant tube extending into said process tube and said bellows means engaging an end of said process tube creating a pressure tight seal or vacuum tight seal;

e. moving said substrates into said process tube and processing said substrates;

f. removing said substrates from said process tube into said elephant tube;

g. removing said elephant tube from sealing engagement with said process tube;

h. removing said plurality of substrates from said elephant tube; and, i. unloading said plurality of substrates from said paddle.

17. Process of claim 16 wherein said paddle moves through an end of said elephant tube.

18. Process of claim 17 wherein a second door-bellows means about said paddle means engages said end of said elephant tube.

19. Process of claim 16 wherein said elephant tube is stainless steel.

20. Process of claim 16 wherein said elephant tube is quartz.

21. Process of claim 16 for LP CVD processes.

* * * * *